United States Patent
Eckl et al.

(10) Patent No.: US 9,562,952 B2
(45) Date of Patent: Feb. 7, 2017

(54) METHOD AND APPARATUS FOR REVEALING ERRORS IN THE CASE OF A LIGHT SIGNAL

(71) Applicant: SIEMENS AKTIENGESELLSCHAFT, Munich (DE)

(72) Inventors: Rolf Eckl, Berlin (DE); Kay Koester, Fredersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 60 days.

(21) Appl. No.: 14/647,932

(22) PCT Filed: Nov. 14, 2013

(86) PCT No.: PCT/EP2013/073789
§ 371 (c)(1),
(2) Date: May 28, 2015

(87) PCT Pub. No.: WO2014/082859
PCT Pub. Date: Jun. 5, 2014

(65) Prior Publication Data
US 2015/0309124 A1     Oct. 29, 2015

(30) Foreign Application Priority Data

Nov. 30, 2012  (DE) .................. 10 2012 221 991

(51) Int. Cl.
*G01R 31/00*     (2006.01)
*G01R 31/08*     (2006.01)
(Continued)

(52) U.S. Cl.
CPC .............. *G01R 31/44* (2013.01); *B61L 5/189* (2013.01); *B61L 5/1881* (2013.01); *H05B 39/04* (2013.01);
(Continued)

(58) Field of Classification Search
CPC ......... G01R 31/44; H05B 39/09; H05B 39/04; B61L 5/189; B61L 5/1881
(Continued)

(56) References Cited

U.S. PATENT DOCUMENTS 3,781,853 A * 12/1973 Jacobs .................. G08B 5/38
                                                        340/331
7,154,403 B2  12/2006 Davenport et al.
7,270,442 B2   9/2007 Davenport et al.

FOREIGN PATENT DOCUMENTS

CN       2901778         5/2007
CN    102030020 A        4/2011
(Continued)

*Primary Examiner* — Amy He
(74) *Attorney, Agent, or Firm* — Laurence Greenberg; Werner Stemer; Ralph Locher

(57) ABSTRACT

A method for revealing a light signal error, in particular for railway safety systems, and a device for carrying out the method includes an electronic signal generator, which can be disconnected in a reversible manner in the event of an error, and a control part which is designed for incandescent lamps for controlling and monitoring the signal generator. In order to be able to evaluate the operation of said type of control part with an incandescent lamp interface also when the signal is flashing, it is provided that when the signal generator is activated in the flashing mode, in which no signal voltage is supplied during the flashing intervals, a timer which is connected to a voltage source measures the duration of the pauses between the flashes, and in the event of an error, maintains the disconnection for at least one flashing cycle and signals to the control part.

8 Claims, 1 Drawing Sheet

(51) Int. Cl.
    *G01R 31/02*     (2006.01)
    *G01R 31/44*     (2006.01)
    *B61L 5/18*     (2006.01)
    *H05B 39/04*     (2006.01)
    *H05B 39/09*     (2006.01)
    *B61L 1/20*     (2006.01)
    *B61L 7/10*     (2006.01)
    *B61L 29/30*     (2006.01)

(52) U.S. Cl.
    CPC ............... *H05B 39/09* (2013.01); *B61L 1/20* (2013.01); *B61L 7/10* (2013.01); *B61L 29/30* (2013.01); *B61L 2207/02* (2013.01)

(58) Field of Classification Search
    USPC .................... 324/414, 405, 532, 535, 537
    See application file for complete search history.

(56) References Cited

FOREIGN PATENT DOCUMENTS

EP     2386458 A1     11/2011
EP     2463174 A1     6/2012

\* cited by examiner

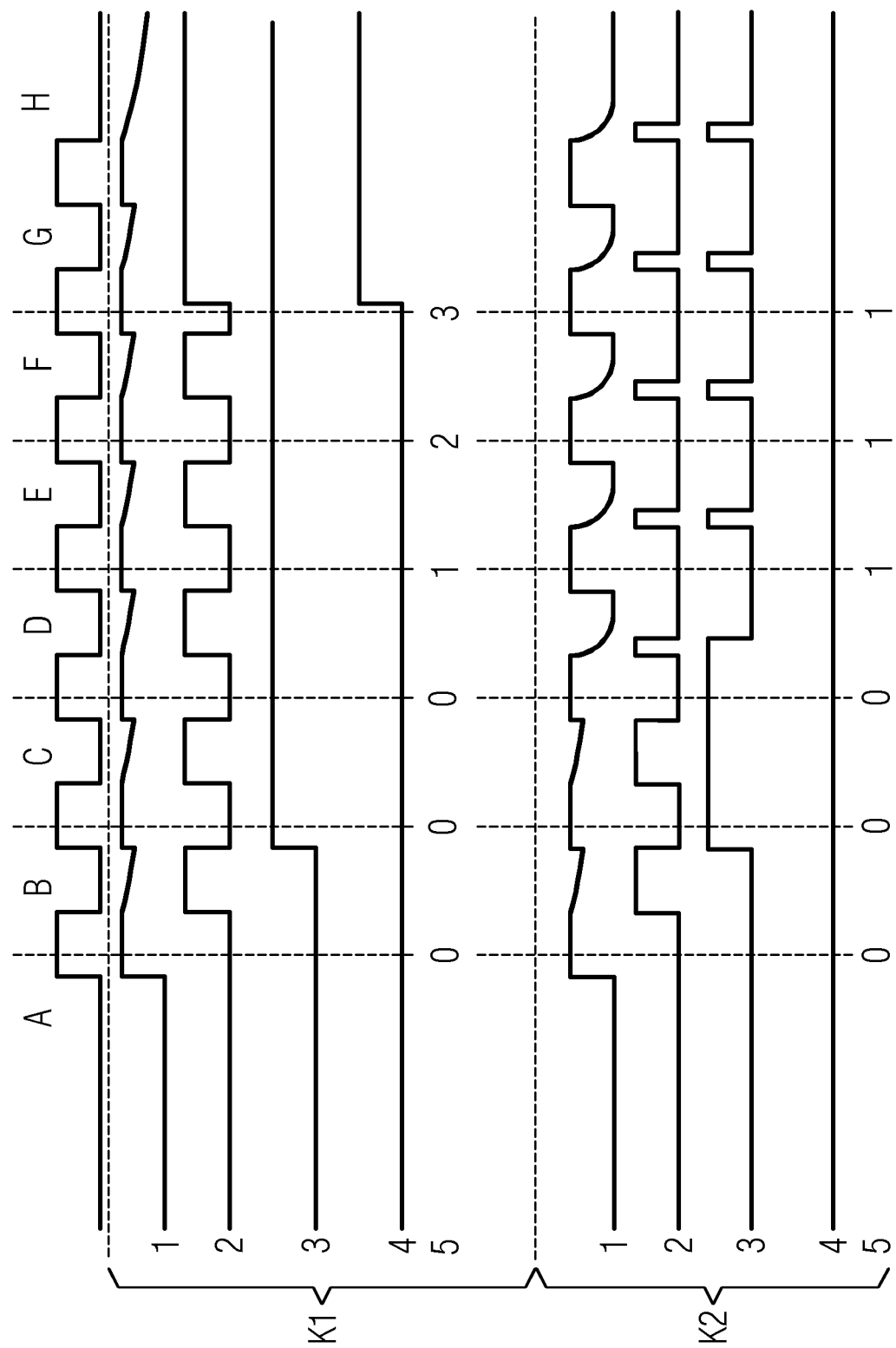

METHOD AND APPARATUS FOR REVEALING ERRORS IN THE CASE OF A LIGHT SIGNAL

BACKGROUND OF THE INVENTION

Field of the Invention

The invention relates to a method for revealing errors in the case of a light signal, particularly for railway safety installations, having an electronic signal transmitter, which disconnects itself reversibly in the event of an error, and an actuating part, designed for incandescent lamps, for actuating and monitoring the signal transmitter and also to an apparatus in this regard.

The description below relates essentially to light signals for railway safety installations, without the invention being limited to this application. Rather, application is also conceivable for other traffic systems or in the industrial sector, for example.

Actuating parts that are designed for incandescent lamp signals usually evaluate a signal current in order to establish an error or correct operation of the light signal. Light signals on an electronic basis, for example LED signals, require some time before they identify an error. After the light signal is switched on, the circuit functions are checked in a self-test. This check requires a flow of current that the actuating part rates as a valid signal current. Following a failed self-test, that is to say in the event of an error, the signal transmitter is disconnected and the error is revealed to the actuating part. To this end, the signal current is altered, for example disconnected, such that the actuating part identifies the error from the signal transmitter by virtue of this alteration of current. The reversible disconnection when a malfunction in the signal transmitter is identified means that a signal current flows whenever the signal has been restarted until an error is possibly identified again. In the case of non-flashing signals, the alteration of current is sufficient for signaling the error in the event of an error, since the on time is very long in comparison with a flash pulse.

In flashing mode, current flows with every restart, that is to say in each flash pulse. The current flows until an error is identified internally in the signal transmitter. This current may already be sufficient to signal to the actuating part where a signal transmitter is free of error. Disconnection of the signal transmitter on account of an error of its own in the on phase of the flashing mode therefore comes shortly before the off phase of the flashing mode or the pulse pause and may not be identified by the actuating part.

BRIEF SUMMARY OF THE INVENTION

Accordingly, the invention is based on the object of specifying a method and an apparatus of the type in question that allow errors to be revealed safely and explicitly in a flashing mode of the signal transmitter.

On the basis of the method, the object is achieved in that when the signal transmitter is actuated in a flashing mode whose flash pauses have no signal voltage applied, a timer with a connected voltage source measures the length of the flash pauses and identifies the flashing mode.

The object is also achieved by an apparatus in which a timer with a connected voltage source is provided both for the purpose of measuring the length of flash pauses in a flashing mode of the signal transmitter for the purpose of identifying the flashing mode and in the event of an error for the purpose of maintaining the disconnection over at least one flash cycle and hence for the purpose of signaling the disconnection to the actuating part.

In this way, the flash pause is incorporated into normal operation of the signal transmitter without a signal current flowing in the flash pauses in order to supply power to the timer. As a result, a notion of flashing becomes an evaluable function of the signal transmitter that is jointly implemented in the self-test. In the event of an error, the electronic signal transmitter automatically disconnects and uses the timer to memorize the error over the flash pause and, after the flash pause, continues to be disconnected for one or more flash cycles. After the signaling of the error has elapsed, the timer terminates the disconnection time, so that restarting of the reversibly disconnectable electronic signal transmitter is enabled. In order to measure the length of the flash pauses, that is to say for the purpose of identifying the flashing mode, the same timer is preferably used as for signaling the error. As in the case of a faulty incandescent lamp, the actuating part identifies the error on the basis of the alteration in the signal current for a current pulse in a flash cycle and the subsequent disconnection time extended to at least one flash cycle by means of the timer. Therefore, error signaling can be reliably realized by means of a disconnection function.

According to the invention, the voltage source of the timer is in the form of a capacitor circuit connected to the signal voltage of the signal transmitter or in the form of a battery circuit or storage battery circuit. Hence, the function of retaining the disconnection is ensured over a flash pause up until the restart. The capacitor circuit ensures that the voltage source of the timer is recharged for every flash, that is to say for every current pulse in the flash cycle. The signaling of an error through disconnection is also possible over a plurality of flash cycles owing to need-based recharging of the voltage source of the timer by means of the capacitor circuit, without a signal current that is valid for the actuating part flowing.

In a particularly preferred embodiment, the timer is of multichannel design. This ensures the highly safety-relevant signaling of an error even when there is a fault in a timer or in its associated voltage source.

According to an embodiment of the invention, the timer has two channels for measuring the length of the flash pauses, wherein the measured values from the channels are compared and an error is signaled if there are differences. The values of the timers of at least two channels are compared and evaluated in each flash cycle. In this case, the identification of a flash pause is sufficient to infer that the timer is operative. If a channel cannot measure or identify the disconnection time, particularly as a result of a timer fault, then this channel is also no longer capable of signaling an identified error, that is to say disconnection, to the actuating part beyond a flash pause. If there is a fault in one channel, the multichannel identification of the flash cycle and the comparison of the measured values of the individual channels therefore allow an error in the flash cycle still to be identified by means of the error-free channel and to be signaled beyond the flash pause.

Preferably, for the purpose of monitoring the operation of the apparatus and including the latter in the self-test and hence in the revelation of errors for the signal transmitter, there may be provided at least one microcontroller that adopts a sleep mode in the flash pauses and sets a flash bit when the first sleep mode begins after the actuation of the signal transmitter in flashing mode. The microcontroller acts as a timer during its sleep mode, with little power being drawn, as a result of which the flash pause can be spanned.

Preferably, a plurality of micro controllers are used as measurement channels for capturing the flashing mode. In the on phase of the flash cycle, the flash bits from the channels are compared with one another in the self-test. If there are differences between the channels, an erroneous self-test is identified and signaling of the error is initiated through disconnection.

Preferably, for the purpose of monitoring the operation of the apparatus and including the latter in the self-test and hence in the revelation of errors for the signal transmitter, there may be provided at least one microcontroller that adopts a sleep mode in the flash pauses and sets a flash bit when the first sleep mode begins after the actuation of the signal transmitter in flashing mode. The microcontroller acts as a timer during its sleep mode, with little power being drawn, as a result of which the flash pause can be spanned. Preferably, a plurality of micro controllers are used as measurement channels for capturing the flashing mode. In the on phase of the flash cycle, the flash bits from the channels are compared with one another in the self-test. If there are differences between the channels, an erroneous self-test is identified and signaling of the error is initiated through disconnection.

BRIEF DESCRIPTION OF THE DRAWING

The invention is explained in more detail below with reference to an illustration by means of a FIGURE.

DESCRIPTION OF THE INVENTION

The single FIGURE shows a timing diagram for flash identification and disconnection in the event of errors in the case of a light signal that is operated in flashing mode. It shows the time curves for flash cycles A to H, voltage of an energy source 1, timer/sleep mode 2, flash bit 3, disconnector 4 and error counter/energy monitor 5 for two measurement channels K1 and K2 in a temporal association. The time curves 1 to 5 illustrate the revelation of errors in the case of a reversibly disconnectable electronic signal transmitter in flashing mode that is connected to an incandescent lamp interface of an actuating part. For the purpose of capturing the flashing mode, a microcontroller is provided for each channel K1 and K2.

The channel K1 is error-free, and in channel K2 the energy source 1 for the sleep mode/timer 2 is erroneous from flash cycle D onward. At the start in flash cycle A, the flash bit 3 for the two channels K1 and K2 is compared. Both channels K1 and K2 are in the same state. In flash cycles B and C, the microcontroller switches to sleep mode 2 in the flash pauses. Since the timer is running in the sleep mode, it identifies the flash pause on account of the pause length and sets the flash bit 3. The flash bit 3 has been set in flash cycles B and C for both channels K1 and K2. The error in the energy source 1 of channel K2 means that the latter is no longer able to measure the flash pauses. The flash bit 3 from channel K2 is therefore reset after the flash pause from flash cycle D. In this example, an error counter 5 is used that, from a value 3 onward, initiates the disconnection 4 for the purpose of error signaling, even if the signal transmitter continues to perform its external function of flashing. Channel K2 can no longer increment the error counter 5, since its energy buffer is faulty. From flash cycle D onward, this channel K2 repeatedly restarts and therefore erases its error counter. From flash cycle G onward, the intact channel K1 effects the disconnection 4. Channel K1 is also capable of maintaining the disconnection 4 over at least one flash cycle H and therefore signals the error, at least during an entire flash cycle H, to the actuating part, which identifies an incorrect signal current. When the error signaling has elapsed, a restart can be effected.

The invention claimed is:

1. A method for revealing errors in a signaling light, the method which comprises:
providing an electronic signal transmitter, which disconnects itself reversibly in the event of an error, and an actuating part, configured for incandescent lamps, for actuating and monitoring the signal transmitter;
providing a timer with a voltage source connected thereto;
actuating the signal transmitter in a flashing mode with flash pauses during which no signal voltage is applied; and
measuring with the timer a length of the flash pauses and identifying the flashing mode.

2. The method according to claim 1, which comprises monitoring a signaling light of a railway safety installation.

3. The apparatus according to claim 2, wherein said voltage source of said timer is a capacitor circuit connected to the signal voltage of the signal transmitter.

4. The apparatus according to claim 2, wherein said voltage source of said timer is a battery circuit or a storage battery circuit.

5. The apparatus according to claim 2, wherein said timer is a multichannel timer.

6. The apparatus according to claim 5, wherein said timer has two channels for measuring the length of the flash pauses, and wherein the measured values from said two channels are compared and an error is signaled if there is a difference.

7. The apparatus according to claim 2, which comprises, for revealing errors and for controlling the disconnection, said timer is embodied by at least one microcontroller.

8. An apparatus for performing the method according to claim 1, the apparatus comprising:
a timer having a connected voltage source, said timer being configured for measuring a length of flash pauses in a flashing mode of the signal transmitter for identifying the flashing mode and, in the event of an error, for maintaining a disconnection over at least one flash cycle and hence for signaling the disconnection to the actuating part.

* * * * *